(12) United States Patent
Estakhri et al.

(10) Patent No.: US 7,594,063 B1
(45) Date of Patent: Sep. 22, 2009

(54) STORAGE CAPACITY STATUS

(75) Inventors: Petro Estakhri, Pleasanton, CA (US); Martin Ragnar Furuhjelm, Grass Valley, CA (US); Ngon Le, Sunnyvale, CA (US); Jerrold Allen Beckmann, San Jose, CA (US); Neal Anthony Galbo, Boca Raton, FL (US); Steffen Markus Hellmold, Novato, CA (US); Jarreth Romero Solomon, Mountain View, CA (US)

(73) Assignee: Lexar Media, Inc., Fremont, CA (US)

( * ) Notice: Subject to any disclaimer, the term of this patent is extended or adjusted under 35 U.S.C. 154(b) by 415 days.

(21) Appl. No.: 10/993,692

(22) Filed: Nov. 19, 2004

Related U.S. Application Data

(63) Continuation-in-part of application No. 10/927,871, filed on Aug. 27, 2004, now Pat. No. 7,464,306.

(51) Int. Cl.
*G06F 12/00* (2006.01)
(52) U.S. Cl. ..................................... 711/103
(58) Field of Classification Search ................. 711/103, 711/156, 170
See application file for complete search history.

(56) References Cited

U.S. PATENT DOCUMENTS

| 4,099,069 A | 7/1978 | Cricchi et al. |
| 4,130,900 A | 12/1978 | Watanabe |
| 4,210,959 A | 7/1980 | Wozniak ..................... 364/200 |
| 4,309,627 A | 1/1982 | Tabata |
| 4,355,376 A | 10/1982 | Gould ......................... 365/230 |
| 4,398,248 A | 8/1983 | Hsia et al. |
| 4,405,952 A | 9/1983 | Slakmon ...................... 360/49 |
| 4,414,627 A | 11/1983 | Nakamura |
| 4,450,559 A | 5/1984 | Bond et al. .................. 371/10 |
| 4,456,971 A | 6/1984 | Fukuda et al. ............... 364/900 |
| 4,468,730 A | 8/1984 | Dodd et al. |
| 4,473,878 A | 9/1984 | Zolnowsky et al. |
| 4,476,526 A | 10/1984 | Dodd |
| 4,498,146 A | 2/1985 | Martinez ..................... 364/900 |
| 4,525,839 A | 6/1985 | Nozawa et al. ................ 371/38 |
| 4,532,590 A | 7/1985 | Wallach et al. |
| 4,609,833 A | 9/1986 | Gutterman |

(Continued)

FOREIGN PATENT DOCUMENTS

AU        0 557 723        1/1987

(Continued)

OTHER PUBLICATIONS

Book—*Computer Architecture and Parallel Processing*, Kai Hwang & Faye A. Briggs, McGraw-Hill Book Co., © 1984, p. 64.

(Continued)

*Primary Examiner*—Hiep T Nguyen
(74) *Attorney, Agent, or Firm*—Leffert Jay & Polglaze, P.A.

(57) ABSTRACT

In one embodiment of the present invention, a memory device is disclosed to include memory organized into blocks, each block having a status associated therewith and all of the blocks of the nonvolatile memory having collectively a capacity status associated therewith and a display for showing the capacity status even when no power is being applied to the display.

16 Claims, 5 Drawing Sheets

CAPACITY   16

NONVOLATILE DISPLAY
42

USED

U.S. PATENT DOCUMENTS

| | | | |
|---|---|---|---|
| 4,616,311 A | 10/1986 | Sato | 364/200 |
| 4,654,847 A | 3/1987 | Dutton | 371/10 |
| 4,710,871 A | 12/1987 | Belknap et al. | 364/200 |
| 4,746,998 A | 5/1988 | Robinson et al. | 360/72.1 |
| 4,748,320 A | 5/1988 | Yorimoto et al. | 235/492 |
| 4,757,474 A | 7/1988 | Fukushi et al. | 365/189 |
| 4,774,700 A | 9/1988 | Satoh et al. | 369/54 |
| 4,780,855 A | 10/1988 | Iida et al. | |
| 4,788,665 A | 11/1988 | Fukuda et al. | |
| 4,797,543 A | 1/1989 | Watanabe | |
| 4,800,520 A | 1/1989 | Iijima | 364/900 |
| 4,829,169 A | 5/1989 | Watanabe | |
| 4,843,224 A | 6/1989 | Ohta et al. | |
| 4,896,262 A | 1/1990 | Wayama et al. | 364/200 |
| 4,914,529 A | 4/1990 | Bonke | 360/48 |
| 4,920,518 A | 4/1990 | Nakamura et al. | 365/228 |
| 4,924,331 A | 5/1990 | Robinson et al. | 360/72.1 |
| 4,943,745 A | 7/1990 | Watanabe et al. | |
| 4,953,122 A | 8/1990 | Williams | 364/900 |
| 4,970,642 A | 11/1990 | Yamamura | |
| 4,970,727 A | 11/1990 | Miyawaki et al. | |
| 5,070,474 A | 12/1991 | Tuma et al. | 395/500 |
| 5,093,785 A | 3/1992 | Iijima | |
| 5,168,465 A | 12/1992 | Harari | 257/320 |
| 5,198,380 A | 3/1993 | Harari | 437/43 |
| 5,200,959 A | 4/1993 | Gross et al. | 371/21.6 |
| 5,218,695 A | 6/1993 | Noveck et al. | |
| 5,220,518 A | 6/1993 | Haq | |
| 5,226,168 A | 7/1993 | Kobayashi et al. | 395/800 |
| 5,227,714 A | 7/1993 | Lou | |
| 5,253,351 A | 10/1993 | Yamamoto et al. | |
| 5,267,218 A | 11/1993 | Elbert | |
| 5,268,318 A | 12/1993 | Harari | 437/43 |
| 5,268,870 A | 12/1993 | Harari | 365/218 |
| 5,270,979 A | 12/1993 | Harari et al. | 365/218 |
| 5,293,560 A | 3/1994 | Harari | 365/185 |
| 5,297,148 A | 3/1994 | Harari et al. | 371/10.2 |
| 5,303,198 A | 4/1994 | Adachi et al. | 365/218 |
| 5,305,276 A | 4/1994 | Uenoyama | |
| 5,305,278 A | 4/1994 | Inoue | |
| 5,315,541 A | 5/1994 | Harari et al. | 365/63 |
| 5,315,558 A | 5/1994 | Hag | |
| 5,329,491 A | 7/1994 | Brown et al. | |
| 5,337,275 A | 8/1994 | Garner | 365/189.01 |
| 5,341,330 A | 8/1994 | Wells et al. | 365/185 |
| 5,341,339 A | 8/1994 | Wells | 365/218 |
| 5,341,341 A | 8/1994 | Fukazo | |
| 5,353,256 A | 10/1994 | Fandrich et al. | 365/230.03 |
| 5,357,475 A | 10/1994 | Hasbun et al. | 365/218 |
| 5,359,569 A | 10/1994 | Fujita et al. | |
| 5,365,127 A | 11/1994 | Manley | |
| 5,369,615 A | 11/1994 | Harari et al. | 365/218 |
| 5,371,702 A | 12/1994 | Nakai et al. | |
| 5,381,539 A | 1/1995 | Yanai et al. | |
| 5,382,839 A | 1/1995 | Shinohara | |
| 5,384,743 A | 1/1995 | Rouy | |
| 5,388,083 A | 2/1995 | Assar et al. | 365/218 |
| 5,396,468 A | 3/1995 | Harari et al. | 365/218 |
| 5,404,485 A | 4/1995 | Ban | |
| 5,406,527 A | 4/1995 | Honma | |
| 5,418,752 A | 5/1995 | Harari et al. | 365/218 |
| 5,422,842 A | 6/1995 | Cernea et al. | 365/185 |
| 5,422,856 A | 6/1995 | Sasaki et al. | |
| 5,428,621 A | 6/1995 | Mehrotra et al. | 371/21.4 |
| 5,430,682 A | 7/1995 | Ishikawa et al. | |
| 5,430,859 A | 7/1995 | Norman et al. | 395/425 |
| 5,431,330 A | 7/1995 | Wieres | |
| 5,434,825 A | 7/1995 | Harari | 365/185 |
| 5,438,573 A | 8/1995 | Mangan et al. | 371/10.3 |
| 5,465,235 A | 11/1995 | Miyamoto | |
| 5,465,338 A | 11/1995 | Clay | |
| 5,471,478 A | 11/1995 | Mangan et al. | 371/10.3 |
| 5,473,765 A | 12/1995 | Gibbons et al. | |
| 5,479,638 A | 12/1995 | Assar et al. | 395/430 |
| 5,485,595 A | 1/1996 | Assar et al. | 395/430 |
| 5,490,117 A | 2/1996 | Oda et al. | |
| 5,495,442 A | 2/1996 | Cernea et al. | 365/185.03 |
| 5,504,760 A | 4/1996 | Harari et al. | 371/40.1 |
| 5,508,971 A | 4/1996 | Cernea et al. | 365/185.23 |
| 5,513,138 A | 4/1996 | Manabe et al. | |
| 5,515,333 A | 5/1996 | Fujita et al. | |
| 5,519,847 A | 5/1996 | Fandrich et al. | |
| 5,523,980 A | 6/1996 | Sakui et al. | |
| 5,524,230 A | 6/1996 | Sakaue et al. | 395/430 |
| 5,530,673 A | 6/1996 | Tobita et al. | |
| 5,530,828 A | 6/1996 | Kaki et al. | |
| 5,530,938 A | 6/1996 | Akasaka et al. | |
| 5,532,962 A | 7/1996 | Auclair et al. | 365/201 |
| 5,532,964 A | 7/1996 | Cernea et al. | 365/189.09 |
| 5,534,456 A | 7/1996 | Yuan et al. | 437/43 |
| 5,535,328 A | 7/1996 | Harari et al. | 395/182.05 |
| 5,541,551 A | 7/1996 | Brehner et al. | |
| 5,544,118 A | 8/1996 | Harari | 365/218 |
| 5,544,356 A | 8/1996 | Robinson et al. | 395/600 |
| 5,552,698 A | 9/1996 | Tai et al. | |
| 5,554,553 A | 9/1996 | Harari | 437/43 |
| 5,563,825 A | 10/1996 | Cernea et al. | 365/185.18 |
| 5,566,314 A | 10/1996 | DeMarco et al. | 395/430 |
| 5,568,439 A | 10/1996 | Harari | 365/218 |
| 5,572,466 A | 11/1996 | Sukegawa | |
| 5,579,502 A | 11/1996 | Konishi et al. | |
| 5,581,723 A | 12/1996 | Hasbun et al. | |
| 5,583,812 A | 12/1996 | Harari | 365/185.33 |
| 5,592,415 A | 1/1997 | Kato et al. | |
| 5,592,420 A | 1/1997 | Cernea et al. | 365/185.18 |
| 5,596,526 A | 1/1997 | Assar et al. | |
| 5,598,370 A | 1/1997 | Niisima et al. | |
| 5,602,987 A | 2/1997 | Harari et al. | |
| 5,603,001 A | 2/1997 | Sukegawa et al. | |
| 5,606,660 A | 2/1997 | Estakhri et al. | |
| 5,611,067 A | 3/1997 | Okamoto et al. | |
| 5,640,528 A | 6/1997 | Harney et al. | |
| 5,642,312 A | 6/1997 | Harari | 365/185.33 |
| 5,648,929 A | 7/1997 | Miyamoto | |
| 5,663,901 A | 9/1997 | Wallace et al. | 365/52 |
| 5,693,570 A | 12/1997 | Cernea et al. | 437/205 |
| 5,712,819 A | 1/1998 | Harari | 365/185.29 |
| 5,719,808 A | 2/1998 | Harari et al. | 365/185.33 |
| 5,723,990 A | 3/1998 | Roohparvar | |
| 5,734,567 A | 3/1998 | Griffiths et al. | |
| 5,745,418 A | 4/1998 | Ma et al. | |
| 5,754,567 A | 5/1998 | Norman | |
| 5,757,712 A | 5/1998 | Nagel et al. | |
| 5,758,100 A | 5/1998 | Odisho | |
| 5,761,117 A | 6/1998 | Uchino et al. | |
| 5,768,190 A | 6/1998 | Tanaka et al. | |
| 5,768,195 A | 6/1998 | Nakamura et al. | |
| 5,773,901 A | 6/1998 | Kantner | |
| 5,778,418 A | 7/1998 | Auclair et al. | 711/101 |
| 5,781,478 A | 7/1998 | Takeeuchi et al. | |
| 5,787,445 A | 7/1998 | Daberko | |
| 5,787,484 A | 7/1998 | Norman | |
| RE35,881 E | 8/1998 | Barrett et al. | |
| 5,799,168 A | 8/1998 | Ban | |
| 5,802,551 A | 9/1998 | Komatsu et al. | |
| 5,809,515 A | 9/1998 | Kaki et al. | |
| 5,809,558 A | 9/1998 | Matthews et al. | |
| 5,809,560 A | 9/1998 | Schneider | |
| 5,818,350 A | 10/1998 | Estakhri et al. | |
| 5,818,781 A | 10/1998 | Estakhri et al. | |
| 5,822,245 A | 10/1998 | Gupta et al. | |
| 5,822,252 A | 10/1998 | Lee et al. | |
| 5,822,781 A | 10/1998 | Wells et al. | |
| 5,831,929 A | 11/1998 | Manning | |

| | | |
|---|---|---|
| 5,835,935 A | 11/1998 | Estakhri et al. |
| 5,838,614 A | 11/1998 | Estakhri et al. |
| 5,845,313 A | 12/1998 | Estakhri et al. |
| 5,847,552 A | 12/1998 | Brown |
| 5,860,083 A | 1/1999 | Sukeawa |
| 5,860,124 A | 1/1999 | Matthews et al. |
| 5,862,099 A | 1/1999 | Gannage et al. |
| 5,890,192 A | 3/1999 | Lee et al. |
| 5,901,086 A | 5/1999 | Wang et al. |
| 5,907,856 A | 5/1999 | Estakhri et al. |
| 5,909,586 A | 6/1999 | Anderson |
| 5,920,884 A | 7/1999 | Jennings, III et al. |
| 5,924,113 A | 7/1999 | Estakhri et al. |
| 5,928,370 A | 7/1999 | Asnaashari |
| 5,930,815 A | 7/1999 | Estakhri et al. |
| 5,933,368 A | 8/1999 | Ma et al. |
| 5,933,846 A | 8/1999 | Endo |
| 5,936,971 A | 8/1999 | Harari et al. |
| 5,937,425 A | 8/1999 | Ban |
| 5,953,737 A | 9/1999 | Estakhri et al. |
| 5,956,473 A | 9/1999 | Ma et al. |
| 5,959,926 A | 9/1999 | Jones et al. |
| 5,966,727 A | 10/1999 | Nishino et al. |
| 5,986,933 A | 11/1999 | Takeuchi et al. |
| 5,987,563 A | 11/1999 | Itoh et al. |
| 5,987,573 A | 11/1999 | Hiraka |
| 5,991,849 A | 11/1999 | Yamada et al. |
| 6,011,322 A | 1/2000 | Stumfall et al. |
| 6,011,323 A | 1/2000 | Camp |
| 6,018,265 A | 1/2000 | Keshtbod |
| 6,021,408 A | 2/2000 | Ledain et al. |
| 6,026,020 A | 2/2000 | Matsubara et al. |
| 6,026,027 A | 2/2000 | Terrell, II et al. |
| 6,034,897 A | 3/2000 | Estakhri et al. |
| 6,035,357 A | 3/2000 | Sakaki |
| 6,040,997 A | 3/2000 | Estakrhi |
| 6,047,352 A | 4/2000 | Lakhani et al. |
| 6,055,184 A | 4/2000 | Acharya et al. |
| 6,055,188 A | 4/2000 | Takeuchi et al. |
| 6,069,827 A | 5/2000 | Sinclair |
| 6,072,796 A | 6/2000 | Christensen et al. |
| 6,076,137 A | 6/2000 | Asnaashari |
| 6,081,447 A | 6/2000 | Lofgren et al. |
| 6,081,878 A | 6/2000 | Estakhri et al. |
| 6,084,483 A | 7/2000 | Keshtbod |
| 6,097,666 A | 8/2000 | Sakui et al. |
| 6,115,785 A | 9/2000 | Estakhri et al. |
| 6,122,195 A | 9/2000 | Estakhri et al. |
| 6,125,424 A | 9/2000 | Komatsu et al. |
| 6,125,435 A | 9/2000 | Estakhri et al. |
| 6,128,695 A | 10/2000 | Estakhri et al. |
| 6,134,145 A | 10/2000 | Wong |
| 6,134,151 A | 10/2000 | Estakhri et al. |
| 6,141,249 A | 10/2000 | Estakhri et al. |
| 6,145,051 A | 11/2000 | Estakhri et al. |
| 6,151,247 A | 11/2000 | Estakhri et al. |
| 6,172,906 B1 | 1/2001 | Estakhri et al. |
| 6,173,362 B1 | 1/2001 | Yoda |
| 6,181,118 B1 | 1/2001 | Meehan et al. |
| 6,182,162 B1 | 1/2001 | Estakhri et al. |
| 6,202,138 B1 | 3/2001 | Estakhri et al. |
| 6,223,308 B1 | 4/2001 | Estakhri et al. |
| 6,226,708 B1 | 5/2001 | McGoldrick et al. |
| 6,230,234 B1 | 5/2001 | Estakhri et al. |
| 6,262,918 B1 | 7/2001 | Estakhri et al. |
| 6,272,610 B1 | 8/2001 | Katayama et al. |
| 6,275,436 B1 | 8/2001 | Tobita et al. |
| 6,279,069 B1 | 8/2001 | Robinson et al. |
| 6,279,114 B1 | 8/2001 | Toombs et al. |
| 6,285,607 B1 | 9/2001 | Sinclair |
| 6,327,639 B1 | 12/2001 | Asnaashari |
| 6,345,367 B1 | 2/2002 | Sinclair |
| 6,374,337 B1 | 4/2002 | Estakhri |
| 6,393,513 B2 | 5/2002 | Estakhri et al. |
| 6,397,314 B1 | 5/2002 | Estakhri et al. |
| 6,411,546 B1 | 6/2002 | Estakhri et al. |
| 6,467,021 B1 | 10/2002 | Sinclair |
| 6,490,649 B2 | 12/2002 | Sinclair |
| 6,567,307 B1 | 5/2003 | Estakhri |
| 6,578,127 B1 | 6/2003 | Sinclair |
| 6,587,382 B1 | 7/2003 | Estakhri et al. |
| 6,711,059 B2 | 3/2004 | Sinclair et al. |
| 6,714,724 B1 * | 3/2004 | Cook ........................ 386/117 |
| 6,725,321 B1 | 4/2004 | Sinclair et al. |
| 6,728,851 B1 | 4/2004 | Estakhri et al. |
| 6,751,155 B2 | 6/2004 | Gorobets |
| 6,757,800 B1 | 6/2004 | Estakhri et al. |
| 6,813,678 B1 | 11/2004 | Sinclair et al. |
| 6,898,662 B2 | 5/2005 | Gorobets |
| 6,912,618 B2 | 6/2005 | Estakhri et al. |
| 6,950,918 B1 | 9/2005 | Estakhri |
| 6,957,295 B1 | 10/2005 | Estakhri |
| 6,973,519 B1 | 12/2005 | Estakhri et al. |
| 6,978,342 B1 | 12/2005 | Estakhri et al. |
| 7,000,064 B2 | 2/2006 | Payne et al. |
| 7,201,005 B2 * | 4/2007 | Voglewede et al. ............ 62/126 |
| 2003/0033471 A1 | 2/2003 | Lin et al. |
| 2003/0227451 A1 * | 12/2003 | Chang ....................... 345/211 |

FOREIGN PATENT DOCUMENTS

| | | |
|---|---|---|
| EP | 0 220 718 A2 | 5/1987 |
| EP | 0 243 503 A1 | 11/1987 |
| EP | 0 392 895 A2 | 10/1990 |
| EP | 0 424 191 A2 | 4/1991 |
| EP | 0 489 204 A1 | 6/1992 |
| EP | 0 522 780 A2 | 1/1993 |
| EP | 0 522 780 B1 | 1/1993 |
| EP | 0 544 252 A2 | 6/1993 |
| EP | 0 613 151 A2 | 8/1994 |
| EP | 0 617 363 A2 | 9/1994 |
| EP | 0 619 541 A2 | 10/1994 |
| EP | 0 663 636 A1 | 7/1995 |
| EP | 0 686 976 A2 | 12/1995 |
| EP | 0 897 579 B1 | 7/2000 |
| EP | 0 891 580 B1 | 11/2000 |
| EP | 0 896 669 B1 | 11/2000 |
| EP | 0 852 766 B1 | 5/2001 |
| EP | 0 852 765 B1 | 9/2001 |
| EP | 0 722 585 B1 | 5/2002 |
| EP | 0 910 826 B1 | 6/2002 |
| EP | 0 691 008 B1 | 11/2002 |
| EP | 0 861 468 B1 | 4/2003 |
| EP | 0 978 040 B1 | 5/2004 |
| EP | 1 157 328 B1 | 5/2005 |
| FR | 93 01908 | 8/1993 |
| GB | 2 251 323 A | 7/1992 |
| GB | 2 291 990 A | 2/1996 |
| GB | 2 291 991 A | 7/1996 |
| GB | 2 297 637 A | 7/1996 |
| GB | 2 304 428 A | 3/1997 |
| GB | 2 348 991 B | 12/2002 |
| GB | 2 351 822 B | 1/2003 |
| GB | 2 384 337 A | 7/2003 |
| GB | 2 384 883 A | 10/2005 |
| GB | 2 384 338 B | 11/2005 |
| GB | 2 384 072 B | 12/2005 |
| GB | 2 411 499 B | 2/2006 |
| IS | 117881 | 5/2003 |
| JP | 59-45695 A | 9/1982 |
| JP | 58-215794 A | 12/1983 |
| JP | 58-215795 A | 12/1983 |
| JP | 59-162695 A | 9/1984 |
| JP | 60-212900 | 10/1985 |
| JP | 61-96598 A | 5/1986 |
| JP | 62-283496 A | 12/1987 |

| | | | |
|---|---|---|---|
| JP | 62-283497 A | 12/1987 |
| JP | 63-183700 A | 7/1988 |
| JP | 1-138694 A | 5/1989 |
| JP | 3-228377 A | 10/1991 |
| JP | 4-57295 A | 2/1992 |
| JP | 4-254994 A | 9/1992 |
| JP | 4-268284 A | 9/1992 |
| JP | 4-278297 A | 10/1992 |
| JP | 4-332999 A | 11/1992 |
| JP | 5-128877 A | 5/1993 |
| JP | 5-282883 A | 10/1993 |
| JP | 6-36578 A | 2/1994 |
| JP | 6-124175 A | 5/1994 |
| JP | 6-124231 A | 5/1994 |
| JP | 6-131889 A | 5/1994 |
| JP | 6-132747 A | 5/1994 |
| JP | 6-149395 A | 5/1994 |
| JP | 6-266596 A | 9/1994 |
| JP | 7-93499 A | 4/1995 |
| JP | 7-311708 A | 11/1995 |
| JP | 8-18018 A | 1/1996 |
| JP | 8-69696 A | 3/1996 |
| JP | 9-147581 A | 6/1997 |
| SU | 1388877 A1 | 4/1988 |
| SU | 1408439 A1 | 7/1988 |
| SU | 1515164 A1 | 10/1989 |
| SU | 1541619 A1 | 2/1990 |
| SU | 1573458 A2 | 6/1990 |
| SU | 1686449 A2 | 10/1991 |
| WO | 84/00628 | 2/1984 |
| WO | WO 94/20906 A1 | 9/1994 |

OTHER PUBLICATIONS

Magazine—"State of the Art: Magnetic VS. Optical Store Data in a Flash", by Walter Lahti and Dean McCarron, Byte magazine dated Nov. 1, 1990. 311, vol. 15, No. 12.

Magazine—Technology Updates, Integrated Cirrcuits, "1-Mbit flash memories seek their role in system design", Ron Wilson, Senior Editor, Computer Design magazine 28 Mar. 1, 1989 No. 5. Tulsa OK. US, pp. 30 and 32.

1992 Symposium of VLSI Circuits Digest of Technical Papers, "EEPROM for Solid State Disk Applications", S. Mehoura et al., SunDisk Corporation. Santa Clara, CA. R.W. Gregor et al., AT&T Bell Laboratories. Allentown, PA, pp. 24 and 25.

Mendel Rosenblum and John K. Ousterhout, The Design and Implementation of a Log-Structured File System, article, 1991, 15 pgs., Berkeley, USA.

Brian Dipert and Markus Levy, Designing with Flash Memory, book, Apr. 1994, 445 pgs., Annabooks, San Diego, USA.

Science Forum, Inc., Flash Memory Symposium '95, symposium, 1995, 13 pgs., Hongo,Bunkyo-ku, Tokyo.

Ross S. Finlayson and David R. Cheriton, An Extended File Service Exploiting Write-Once Storage, article, 1987, 10 pgs, ACM.

Jason Gait, The Optical File Cabinet: A Random-Access File System for Write-Once Optical Disks, article, Jun. 1988, 12 pgs., Beaverton, Oregon.

Henry G. Baker, Memory Management, book, 1995, 19 pgs., Springer-Verlag Berlin Heidelberg, Germany.

Sape J. Mullender and Andrew S. Tanenbaum, A Distributed File Service Based on Optimistic Concurrency Control, article, 1985, 12 pgs., ACM.

Hiroshi Nakamura, Junichi Miyamoto, Kenichi Imamiya and Yoshihisa Iwata, A Novel Sense Amplifier for Flexible Voltage Operation NAND Flash Memories, symposium, 1995, VLSI Circuits Digest of Technical Papers., 2 pgs.

Hiroshi Nakamura, Junichi Miyamoto, Kenichi Imamiya, Yoshihisa Iwata, Yoshihisa Sugiura and Hideko Oodaira, A Novel Sensing Scheme with On-Chip Page Copy for Flexible Voltage NAND Flash Memories, article, Jun. 1996, p pgs., vol. E79-C, No. 6.

Takaaki Nozaki, Toshiaki Tanaka, Yoshiro Kijiya, Eita Kinoshita, Tatsuo Tsuchiya and Yutaka Hayashi, A 1-Mb EEPROM with MONOS Memory Cell for Semiconductor Disk Application, article, 1991, 5 pgs., Journal Of Solid-State Circuits, vol. 26, No. 4.

Kai Hwang and Faye A. Briggs, Computer Architecture and Parallel Processing, book, 1984, McGraw-Hill, Inc., 2 pgs., US.

Walter Lahti and Dean McCarron, State of the Art: Magnetic VS. Optical Store Data in a Flash, article, 1990, 7 pgs., vol. 15, No. 12, McGraw-Hill, Inc., US.

Ron Wilson, Integrated Circuits; 1-Mbit flash memories seek their role in system design, article, Mar. 1, 1989, 2 pgs., No. 6, Tulsa, OK.

S. Mehroura, J.H. Yuan, R.A. Cemea, W.Y. Chien, D.C. Guteman, G. Samachisa, R.D. Noman, M. Mofidi, W.Lee, Y. Fong, A. Mihnea, E. Hann, R.W. Gregor, E.P. Eberhardt, J.R. Radosevich, K.R. Stiles, R.A. Kohler, C.W. Leung, and T.J. Mulrooney, Serial 9MbF EEPROM for Solid State Disk Applications, symposium, 1992, 2 pgs., Mountain View, CA.

Steven H. Leibson, Nonvolatile, in-circuit-reprogrammable memories, article, Jan. 3, 1991, 12 pgs., EDN, Circle No. 12.

Walter Lahti and Dean McCarron, State of the Art: Magnetic VS. Optical Store Data in a Flash, article, 1990, 7 pgs., vol. 15, No. 12, McGraw-Hill, Inc., US.

Kai Hwang and Faye A. Briggs, Computer Architecture and Parallel Processing, book, 1984, McGraw-Hill, Inc., 2 pgs., US.

Steven H. Leibson, Nonvolatile, in-circuit-reprogrammable memories, article, Jan. 3, 1991, 12 pgs., EDN, Circle No. 12.

Ramon Caceres, Fred Douglis, Kai Li and Brian Marsh, Operating System Implications of Solid-State Mobile Computers, article, 7 pgs., Oct. 1993, Workshop on Workstation Operting Systems.

Michael Wu and Wily Zwaenepoel, A Non-Volatile, Main Memory Storage System, 12 pgs., 1994, ACM, San Jose, CA USA.

Dave Bursky, Innovative flash memories match DRAM densities; available with a choice of features, flash memories are finding homes in many systems (includes related articles on the origins of flash, and on the differences between NAND and NDR flash memories), article, May 16, 1994, 9 pgs., Electronic Design, v.42, n.10, The Gate Group.

Anthony Cataldo, New flash enhancements up ante. (Intel's 28F400BV-120 and 28F004BV-120, Atmel's AT29BV010 and AT29BV020, and Samsung Semiconductor's KM29V32000 "flash" memory devices)(Product Announcement), article, Mar. 13, 1995, 4 pgs., Electronic News, v.41, n.2056, The Gate Group.

Sam Weber, "Flash" modules' portability, reusability, small size valued for a host of APPs-Consumer formats flocking to "flash", article, Jul. 22, 1996, 9 pgs., Electronic Engineering Times, n.911. CMP Media.

Toshiba, MOS Memory (Non-Volatile), 1995, Data Book.

Stan Baker, But Integration Calls for Hardware, Software Changes: Flash: designers face the dawn of a new memory age, article, Sep. 12, 2003, 5 pgs., Electronic Engineering Times, 1990, N.619, 41, CMP Media.

Toshiba, Toshiba MOS Digital Integrated Circuit Silicon Gate CMOS, (TC58NS5120C) Mar. 21, 2001, 43 pgs., Data Book.

Toshiba Corporation, SMIL (Smartmedia Interface Library) Hardware Edition Version 1.00, Jul. 2000, 36 pgs., Data Book.

Toshiba, Toshiba MOS Digital Integrated Circuit Silicon Gate, (TC58512FT), Mar. 5, 2001, 43 pgs., Data Book.

Toshiba, Toshiba MOS Digital Integrated Circuit Silicon Gate, (TC58DVM92A1FT00), Jan. 10, 2003, 44 pgs., Data Book.

Toshiba, Toshiba MOS Digital Integrated Circuit Silicon Gate, (TC58DVG02A1FT00), Jan. 10, 2003, 44 pgs., Data Book.

Toshiba, Toshiba MOS Digital Integrated Circuit Silicon Gate, (TH58100FT), Mar. 5, 2001, 43 pgs., Data Book.

35Nonvolatile Memory Technology Review, A Time of Change, Proceedings 1993 Conference, Jun. 22-24, 1993, Linthlcum Heights, MD USA.

Toshiba Corporation, SMIL (Smartmedia Interface Library) Software Edition Version 1.00, Jul. 1, 2000, 136 pgs., Data Book.

Toshiba, MOS Memory (Non-Volatile), 1996, 279 pgs., Data Book.

Dan Auclair, Optimal Solid State Disk Architecure For Portable Computers, symposium, Jul. 9, 1991, 7 pgs., SunDisk Corporation.

* cited by examiner

100% Capacity Remains

STORAGE CAPACITY STATUS

CROSS REFERENCE TO RELATED APPLICATIONS

This application is a continuation-in-part of a previously-filed U.S. patent application Ser. No. 10/927,871, entitled "STATUS OF OVERALL HEALTH OF NONVOLATILE MEMORY", filed on Aug. 27, 2004 now U.S. Pat. No. 7,464,306 by Martin Ragnar Furuhjelm, the disclosure of which is herein incorporated by reference as though set forth in full.

BACKGROUND OF THE INVENTION

1. Field of the Invention

This invention relates generally to the field of nonvolatile or flash or EEPROM memory and in particular to a method and apparatus for measuring and displaying the storage capacity of such memory.

2. Description of the Prior Art

Nonvolatile memory, such as FLASH memory and EEPROM, has gained notoriety in the recent decade, namely due to its fast write time characteristics and ability to maintain storage of information even when no power is connected thereto. Nonvolatile memory is now employed in a wide number of applications, such as digital film for digital cameras, as a drive (or mass storage) in personal computers (PCs) or other hosts, hand-held electronic devices such as personal data access (PDAs) and the like.

During manufacturing of nonvolatile memory devices, certain defects within the memory are detected and marked accordingly. Manufacturing defects are inherent in nonvolatile memory devices and other types of defects arise during use of the devices. Other types of defects can and generally result from repeated usage of the device. For example, a nonvolatile memory device is now generally expected to be used or re-written thereto anywhere from thousands to tens of thousands to hundreds of thousands to one million times and thereafter, the device typically becomes unusable due to the number of defective memory locations therein. As nonvolatile memory is utilized, it is written thereto for use in storing information and then it is erased prior to use of the same locations, i.e. re-written. In most applications, nonvolatile memory is organized into blocks and when a write is initiated by a host that is coupled to the memory, generally through a controller device, one or more blocks are written thereto. Prior to re-writing the one or more blocks, the latter need be erased and when a block undergoes anywhere from thousands to tens of thousands to hundreds of thousands to one million or so write and erase operations, it will generally become defective or its ability to store information reliably deteriorates. Thus, the more nonvolatile or flash memory is utilized, the more defects grow.

Additionally, nonvolatile memory has a limited capacity, which is basically, in large part, dependent upon the architecture or design of the nonvolatile memory. When nonvolatile memory devices are employed, data or information written thereto reduces the amount of available storage. The storage capacity of the nonvolatile memory clearly changes as its use changes. For example, initially, notwithstanding manufacturing defects, the storage capacity of the nonvolatile memory is 100% or the memory is completely available for storage. However, as information is stored therein, its storage capacity decreases until such time as when there is no further available locations for storage of information.

A computer system or host can always determine the amount of storage space remaining available for storage within a nonvolatile memory device. It should be noted that nonvolatile memory is intended to refer to any kind of memory, such as flash and EEPROM, that is capable of preserving information even when power is not being applied thereto. The storage capacity of a device, such as a card that includes nonvolatile memory is currently known by a host that is coupled to the nonvolatile memory generally through a controller device, but it is not displayed to the user of the card. Thus, in current nonvolatile systems, information regarding storage capacity is only available within the host and only when the nonvolatile memory device is coupled to the host.

Therefore, the need arises for a method and apparatus to measure and display the storage capacity of nonvolatile or flash memory of nonvolatile memory device(s) and to do so even when the nonvolatile memory device is not coupled to a host.

SUMMARY OF THE INVENTION

Briefly, in accordance with one embodiment of the present invention, a memory device is disclosed to include memory organized into blocks, each block having a status associated therewith and all of the blocks of the nonvolatile memory having collectively a capacity status associated therewith and a display for showing the capacity status even when no power is being applied to the display.

IN THE DRAWINGS

DETAILED DESCRIPTION OF THE PREFERRED EMBODIMENT

Figure 1:
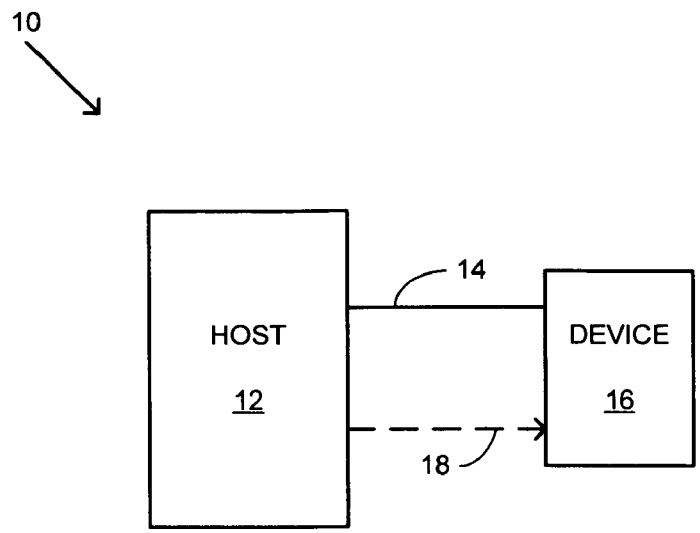
FIG. 1 shows a nonvolatile memory system 10 in accordance with an embodiment of the present invention.

Referring now to FIG. 1, a memory system 10 is shown to include a host 12 and a memory device 16 through an interface 14 in accordance with an embodiment of the present invention. The host 12 may be any number of electronic systems or devices, such a personal computer (PC), a server, a digital camera and the like. The device 16 may include nonvolatile memory or volatile memory, in either case, as will become apparent, the capacity status of such memory is displayed to a user of the system 10.

The device 16, while not shown in FIG. 1, includes a controller device coupled to one or more nonvolatile memory devices. The controller transfers digital information between the host 12 and the nonvolatile memory devices. The nonvolatile memory devices store information transferred by the host upon direction from the controller device and can include any type of nonvolatile memory, such as flash memory, EEPROM memory or the like. The interface 14 can be any of the known interfaces currently being employed and adopted by the industry at large, such as a Universal Serial Bus (USB) interface, a small computer systems interface (SCSI), firewire and the like. Examples of the device 16 include but are not limited to a USB memory device, a memory stick, or any other type of storage medium including nonvolatile memory devices.

As noted earlier, a user of the device 16 (not shown in FIG. 1) remains oblivious to a measure indicative of the storage capacity of the nonvolatile memory device(s) within the device 16. Thus, a user of the system 10 and the host 12 remain unaware of the number of blocks or usable blocks included within the nonvolatile memory. However, in the embodiment of FIG. 1 and further of those that follow, the host 12 and/or a user of the system 10 are aware of the storage capacity of the nonvolatile memory within the device 16. In the embodiment of FIG. 1, the host 12 communicates with the device 16, at 18, to provide storage capacity information thereto.

Each block has associated therewith a status, i.e. 'used' or programmed, or 'free', which is available or remains to be programmed. A block is generally considered 'free' after the nonvolatile memory is initialized and prior to programming thereof with user data, or it can become 'free' after the host makes it available for re-use in the file system.

For example, through a predefined command, from the device 16 to the host 12, through the interface 14, the device 16 asks the host 12 of its storage capacity status. The host 12 responds back, at 18, informing the device 16 of storage capacity of the device 16, which is ultimately displayed to a user of the device 16. Alternatively, the host 12 regularly updates the device 16 with capacity status information. For example, following every write operation that modifies the capacity of the device 16, the host 12 updates the device 16 with capacity status information. In fact, the storage capacity information or capacity status information is continuously displayed to a user or alternatively, may be displayed upon request, as will be discussed further herein.

Information generally appears in the form of files from the operating system of a computer, accordingly, the host 12 maintains a file structure for storing and retrieving files in a predefined order vis-á-vis the blocks available for storage within the nonvolatile memory device. That is, a particular file may be stored in a number of blocks and each time the file is updated or revised, there may be other or additional blocks employed for such storage. The host maintains the usage of the blocks but the device 16 does not necessarily do so.

Because the device 16 does not have information regarding the file structure, it cannot readily determine when data or information is obsolete or "deleted" from the nonvolatile memory devices, which are included in the device 16. Thus, the host 12 calculates the storage capacity status and informs the device 16 of the same, at 18, and then, the device 16 displays the storage capacity status.

The host 12 calculates the storage capacity status as the remaining capacity, in percent, of the original capacity or total capacity, i.e. "used" or "free".

Figure 2:
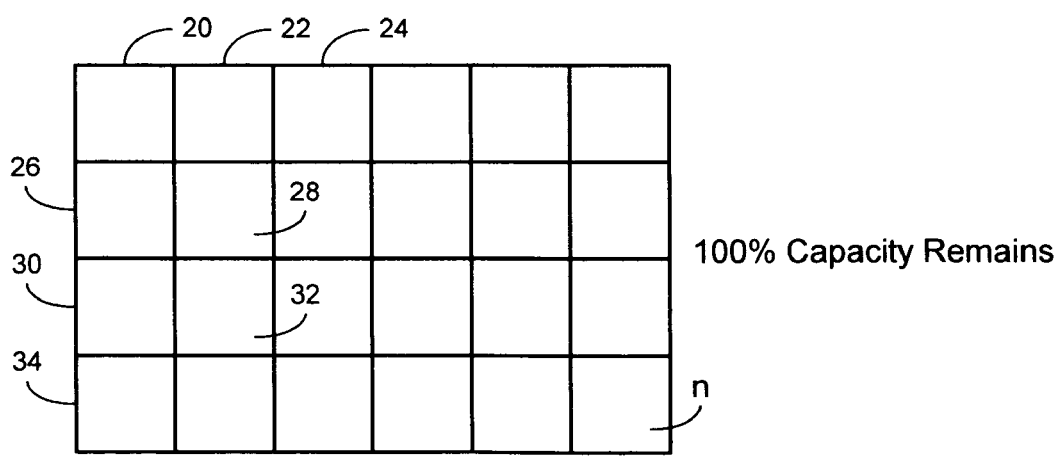
FIGS. 2-5 show examples of the capacity status of the blocks 20-*n* of nonvolatile memory within the device 16 of FIG. 1.
Figure 3:
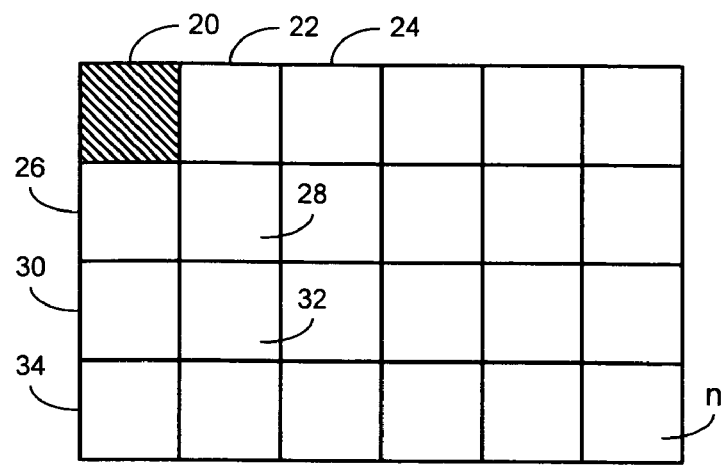
Figure 4:
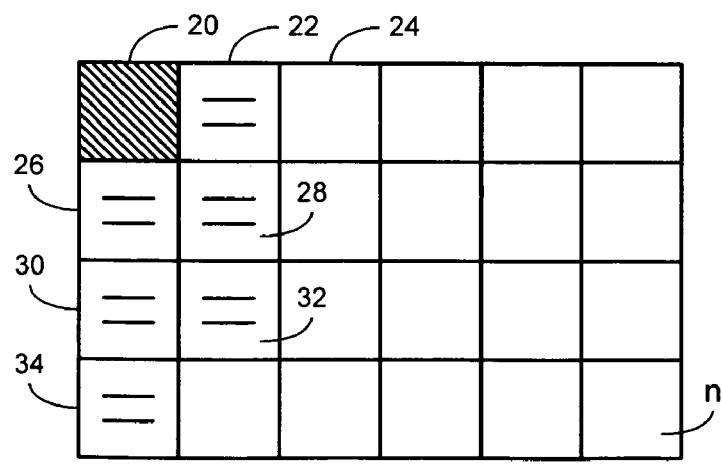

FIG. 2 shows blocks 20-*n* within nonvolatile memory of the nonvolatile memory device of the device 16 of FIG. 1. The blocks 20-*n* are all shown to be available for programming, thus, at this point, the device 16 includes nonvolatile memory having 100% capacity, i.e. the nonvolatile memory is empty or 'free'. FIG. 3 shows the blocks 20-*n* after the host 12 of FIG. 1 has initialized the device 16. After initialization, some blocks may be designated to be used for storage of overhead information and are thus not available for programming. One example of such blocks, is block 20 in FIG. 3. While one of the blocks, block 20, is not available for programming, the capacity status for the nonvolatile memory is still considered 100% empty or available because all of the blocks that are available for programming of user data or information are 'free'. FIG. 4 shows the blocks 20-*n* with the block 20 being used for storing overhead information and the blocks 22, 26, 28-34 having been programmed by a user. In this case, obviously, the nonvolatile memory has a capacity that is less than 100%, specifically, the value of the capacity status of the nonvolatile memory is 23 (number of available blocks for programming user data) minus 6 (the number of used or unavailable blocks that have already been programmed with user data) divided by 23 (number of available blocks for programming user data) times 100 or 74%.

Figure 5:
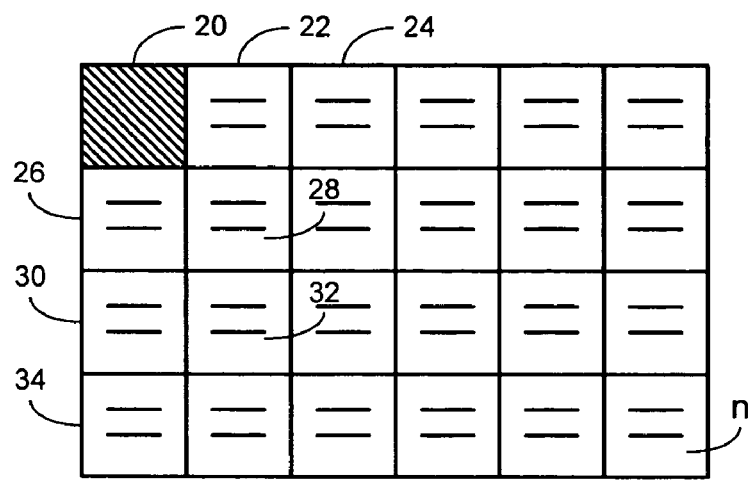
Figure 6:
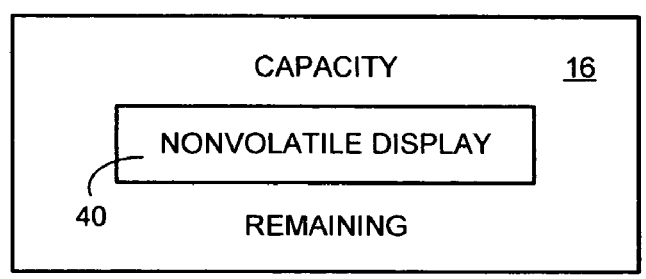
FIGS. 6-10 illustrate examples of a display showing the capacity status of the nonvolatile memory located within the device 16.
Figure 7:
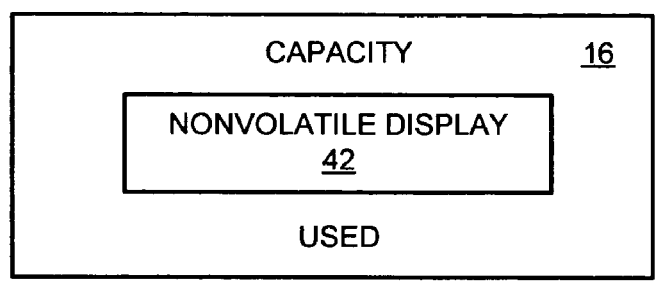

FIG. 5 shows the status of the blocks 20-*n* after additional programming by the user. That is, the remainder of the 24 blocks that were previously free, in FIG. 4, are now all shown to be 'used' or programmed. Thus, the capacity status of the blocks 20-*n* is 0% or full.

Figure 8:
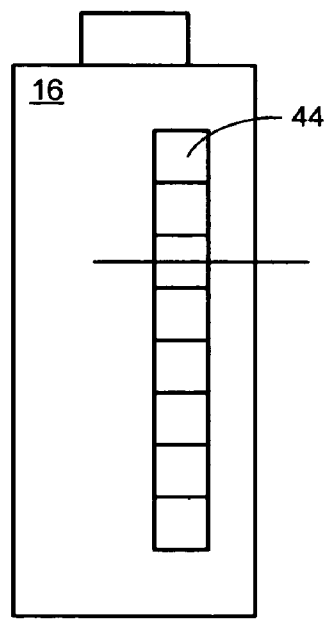

FIGS. 2-5 show examples of the capacity status of the blocks 20-*n* of nonvolatile memory within the device 16 of FIG. 1. The capacity status is shown, as a display, on the device 16 of FIG. 1, in a manner visible to a user of the device 16. The display can take on many forms, examples of such a display are shown in FIGS. 6-10. For example, in FIG. 6, the nonvolatile display 40 shows the capacity remaining, i.e. the percentage of blocks that remain unprogrammed, whereas, in FIG. 7, the nonvolatile display shows the capacity used, i.e. the percentage of blocks have already been programmed. FIG. 8 shows, in step form, the approximate number of blocks that have either been programmed or remain to be programmed.

Figure 9:
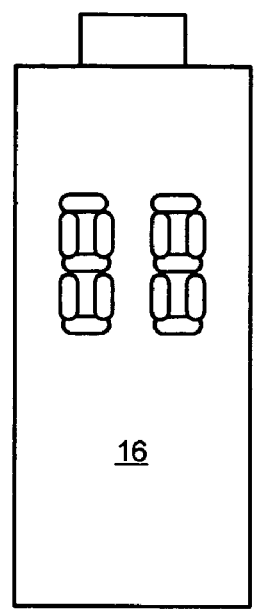
Figure 10:
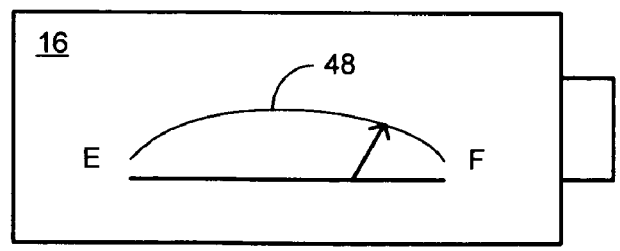

FIG. 9 shows the device 16 having a liquid crystal display (LCD) for showing the percentage of blocks programmed or percentage of blocks that are available. FIG. 10 shows the device 16 with a gauge 48 showing approximately the number of blocks that remain to be programmed or that are programmed.

In yet another embodiment display, a light emission diode (LED) is employed showing the capacity status using different color lights. In this case, the device 16 need be provided power by either being plugged into or coupled to the host or otherwise. The LED may be used to indicate storage capacity of the device 16 or health status. In the case of health status, as an example, if the LED shows a red color, this may be indicative of the health status of the device 16 being zero or no spares available for programming and an orange/yellow color may indicate 50% or less availability and a green color may indicate an availability of more than 50%. The colors displayed by the LED are a design choice and can be readily altered to indicate different status.

As to storage capacity status, as an example, a red-colored LED may indicate that the device 16 is full and has no available memory for programming, an orange/yellow-colored LED may be indicative of a capacity of less than 50% and a green-colored LED may be indicative of a capacity of more than 50% remaining for programming. Another example is, a green flashing light can be used to indicate a semi-empty nonvolatile memory, a continuous green light can be used to indicate an empty or free nonvolatile memory and a red light can be used to indicate a full nonvolatile memory. The colors displayed by the LED are a design choice and can be readily altered to indicate different status.

The particular way in which a display is presented is left up to the designer of the device 16, similarly, whether the number of programmed blocks is shown or the number of blocks remaining to be programmed is shown is left up to the designer of the device 16. The display need not show a percentage value indicative of the capacity status, rather, an absolute number may be displayed, such as shown in FIG. 9 or any of the other types of displays conceivable to one of ordinary skill in the art.

It should be noted that capacity status information is displayed even if power is disconnected from the device 16. That is, even if the device 16 is unplugged from the host 12, in FIG. 1, the nonvolatile display 40 or 42 will continue to show the capacity status. This is due to the use of nonvolatile display employing electronic ink. Electronic ink is known to the industry. Other types of nonvolatile memory, known to those in the art, is contemplated for use to show capacity status even when no power is provided. Also, health status, as described hereinabove may be displayed when no power is provided using electronic ink or other types of nonvolatile displays.

The capacity status information is displayed on a monitor, on a continuous basis, if desired, and in the form of an icon, such as by changing the color of the icon as the capacity is used or by changing the shape of the icon to indicate remaining capacity.

There are a number of ways of implementing displaying capacity status. One way is for the operating system to show such information to a user through a monitor. This is easily accomplished as the host is in a position to always knows, through calculations, such as the one presented above, the capacity status of the nonvolatile memory of a device. Another way is to have the host communicate the capacity status information through the interface 18 to the device 16 for displaying thereof by the device 16 and having the device 16 displaying the same on a nonvolatile display, such as those presented in FIGS. 6-10. Yet another way is to have the device 16 determine the capacity status by reading the file structure maintained by the host 12 and returning the determined value to the host for displaying on a monitor. Still another way is to have the device calculate or determine the capacity status by reading the file structure maintained by the host 12 and displaying the same on a nonvolatile display, such as those presented in FIGS. 6-10.

Power may be provided to the display in a number of ways understood by those of ordinary skill in the art. Some of these ways include a capacitor coupled to the display for the purpose of providing power. Another way is to use a battery that is either chargeable or non-chargeable to provide power to the display.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A flash memory device adapted to be coupled to a host system, the memory device comprising:
    a nonvolatile memory organized into blocks, each block having a status associated therewith and all of the blocks of the nonvolatile memory having collectively a capacity status associated therewith; and
    a non-volatile display for indicating a quantity of non-volatile memory blocks available for programming in response to the capacity status, the non-volatile display indicating the quantity after being removed from a host power supply and without an internal power supply coupled to the non-volatile display.

2. A memory device as recited in claim 1 wherein the device calculates the capacity status.

3. A memory device as recited in claim 1 wherein the memory device is responsive to a value representing the capacity status for displaying thereof on the non-volatile display.

4. A memory device as recited in claim 1 wherein a capacity status is calculated and displayed on the non-volatile display by subtracting a number of 'used' blocks from a total number of blocks that are available for programming divided by the total number of blocks.

5. A memory device as recited in claim 1 wherein the non-volatile display indicates a change in the capacity status by flashing.

6. A memory system as recited in claim 1 wherein the device calculates the capacity status.

7. A memory system as recited in claim 6 wherein the calculation of the capacity status is performed by the device reading a file structure from the host.

8. A memory system as recited in claim 7 wherein the non-volatile display displays the calculated capacity status.

9. A memory system comprising:
    a host adapted to accept a flash memory device; and
    a flash memory device coupled to the host including,
        a nonvolatile memory organized into blocks, each block having a status associated therewith and all of the blocks of the nonvolatile memory having collectively a capacity status associated therewith; and
        a non-volatile display for indicating a change in the capacity status of the nonvolatile memory by a change in color wherein the non-volatile display indicates the change in capacity status after being uncoupled from the host and without an internal power supply coupled to the non-volatile display.

10. A memory system as recited in claim 9 wherein the host calculates the capacity status.

11. A memory system as recited in claim 10 wherein the calculated capacity status is continuously displayed on a monitor in the form of an icon.

12. A memory system as recited in claim 11 wherein the calculated capacity status is provided to the device for displaying on the non-volatile display.

13. A memory system as recited in claim 9 wherein the capacity status is indicative of either the number of blocks remaining to be programmed or the number of blocks that are 'free'.

14. A memory system as recited in claim 9 wherein the capacity status is calculated by subtracting the number of 'used' blocks from the total number of blocks that are available for programming divided by the total number of blocks.

15. A memory system as recited in claim 9 wherein the capacity status is displayed as a percentage value on the non-volatile display.

16. A method for displaying information regarding capacity status of flash memory of a memory system comprising:
    calculating the capacity status representing the number of 'free' or the number of programmed blocks within the flash memory; and
    displaying the capacity status on a non-volatile display that does not require a power supply after being removed from the memory system.

* * * * *

UNITED STATES PATENT AND TRADEMARK OFFICE
CERTIFICATE OF CORRECTION

PATENT NO.       : 7,594,063 B1
APPLICATION NO. : 10/993692
DATED            : September 22, 2009
INVENTOR(S)      : Estakhri et al.

It is certified that error appears in the above-identified patent and that said Letters Patent is hereby corrected as shown below:

Page 1 of 1

On the Title Page:

The first or sole Notice should read --

Subject to any disclaimer, the term of this patent is extended or adjusted under 35 U.S.C. 154(b) by 532 days.

Signed and Sealed this

Twenty-eighth Day of September, 2010

David J. Kappos
*Director of the United States Patent and Trademark Office*